(12) United States Patent
Loizou et al.

(10) Patent No.: US 12,245,382 B2
(45) Date of Patent: Mar. 4, 2025

(54) THREE-DIMENSIONAL PATTERNED MODULE EXTERIOR SURFACE FOR IMPROVED HEAT DISSIPATION AND METHOD OF FABRICATING

(71) Applicant: Qorvo US, Inc., Greensboro, NC (US)

(72) Inventors: Loizos Loizou, Grasbrunn (DE); Tobias Mangold, Huglfing (DE); Andreas Link, Laaber (DE)

(73) Assignee: Qorvo US, Inc., Greensboro, NC (US)

( * ) Notice: Subject to any disclaimer, the term of this patent is extended or adjusted under 35 U.S.C. 154(b) by 218 days.

(21) Appl. No.: 17/989,954

(22) Filed: Nov. 18, 2022

(65) Prior Publication Data

US 2023/0180393 A1 Jun. 8, 2023

Related U.S. Application Data

(60) Provisional application No. 63/285,214, filed on Dec. 2, 2021.

(51) Int. Cl.
*H05K 3/28* (2006.01)
*H05K 1/18* (2006.01)
*H05K 3/30* (2006.01)

(52) U.S. Cl.
CPC .......... *H05K 3/284* (2013.01); *H05K 1/181* (2013.01); *H05K 3/303* (2013.01); *H05K 2201/10431* (2013.01)

(58) Field of Classification Search
CPC ........ H05K 3/284; H05K 3/303; H05K 1/181; H05K 2201/10431
USPC ....................................................... 361/760
See application file for complete search history.

(56) References Cited

U.S. PATENT DOCUMENTS

| | | | |
|---|---|---|---|
| 2009/0002971 A1 | 1/2009 | Carey et al. | |
| 2019/0067156 A1* | 2/2019 | Kim | ............ H01L 23/3675 |
| 2020/0007109 A1* | 1/2020 | Nakagawa | ......... H03H 9/02559 |
| 2020/0126898 A1* | 4/2020 | Somada | ............ H01L 21/568 |
| 2020/0220513 A1* | 7/2020 | Vetury | ............ H10N 30/877 |

FOREIGN PATENT DOCUMENTS

KR 20060022763 A * 3/2006

OTHER PUBLICATIONS

Extended European Search Report for European Patent Application No. 22209672.9, mailed May 16, 2023, 10 pages.

* cited by examiner

*Primary Examiner* — Andargie M Aychillhum
(74) *Attorney, Agent, or Firm* — Withrow & Terranova, P.L.L.C.

(57) ABSTRACT

A module includes a protective shield with a three-dimensional (3D) pattern to increase a rate of heat dissipation. As circuit components get smaller in size, more circuit components can fit into a module, thereby increasing heat density in the module. Some of the heat in a module is conducted through an overmold disposed on the circuit components. The heat conducted through the overmold then dissipates through an optional protective shield on an exterior surface of the overmold. A rate of heat dissipation depends on the surface area of the overmold and, if any, the protective shield. In an exemplary aspect, a 3D pattern is formed in the exterior surface of the overmold to increase the surface area to increase a rate of heat dissipation from the module. Improved heat dissipation improves performance and product life of the circuit components in the module.

21 Claims, 5 Drawing Sheets

THREE-DIMENSIONAL PATTERNED MODULE EXTERIOR SURFACE FOR IMPROVED HEAT DISSIPATION AND METHOD OF FABRICATING

RELATED APPLICATIONS

This application claims the benefit of U.S. provisional patent application Ser. No. 63/285,214, filed on Dec. 2, 2021, the disclosure of which is hereby incorporated herein by reference in its entirety.

FIELD OF THE DISCLOSURE

The technology of the disclosure relates generally to electronic packaging and, more particularly, to heat dissipation from a module containing semiconductor dies.

BACKGROUND

Modern consumer electronic devices demand more dense and compact printed circuit boards and more carrier aggregation combinations to achieve higher data rates. This requires newer electronic devices to fit more circuits into a smaller volume. This can be particularly true of mobile devices having a variety of communication modes (e.g., cellular, WiFi, Bluetooth). Mobile devices include radio-frequency (RF) front-end modules that include multiple transmitter (TX) circuits and receiver (RX) circuits, each with corresponding filters and power amplifiers. RF front-end modules become smaller while density of the components and integration complexity increase over time. Packaging technology struggles to accommodate the needs of newer RF modules while handling issues such as thermal dissipation and electromagnetic interference. For example, to achieve a reduction in module size, dies may be located closer together and even placed on a back side of the module. However, a smaller module size also reduces the surface area from which internal heat can be dissipated to the environment. To further exacerbate the thermal problem, even as modules are made smaller, more power amplifiers (PAs) are required on an RF module for evolved-universal terrestrial radio access-new radio dual connectivity (EN-DC) applications, which will produce more heat in a module.

SUMMARY

Aspects disclosed in the detailed description include a three-dimensional (3D) patterned module exterior surface for improved heat dissipation. A method of fabricating modules with 3D patterned exteriors is also disclosed. As circuit components get smaller in size, more circuit components can fit into a same area of a module, thereby increasing heat density in the module. To avoid overheating, the rate of external heat dissipation from the module needs to keep up with the rate of heat generation, but heat dissipation is dependent on surface area. Much of the heat generated within a module is conducted through an overmold disposed on the circuit components. The heat conducted through the overmold then dissipates through an exterior surface of the overmold. In some examples, a protective shield may be disposed on the overmold, and the heat also propagates through the protective shield. A factor in the rate of heat dissipation is the surface area of the exterior of the overmold. In an exemplary aspect, a three-dimensional (3D) pattern is formed in the exterior surface of the overmold to increase the surface area and, therefore, increase a rate of heat dissipation from the module. In examples including a protective shield, the 3D pattern is also formed in the protective shield to provide a higher rate of heat dissipation. Improved heat dissipation improves the performance and product life of the circuit components in the module.

In an exemplary aspect, a module comprising a laminate and at least one circuit component disposed on the laminate is disclosed. The module includes an overmold disposed on the at least one circuit component. The overmold comprises an exterior surface comprising a three-dimensional pattern.

In another exemplary aspect, a method of manufacturing a module is disclosed. The method comprises coupling at least one circuit component to a laminate and forming an overmold on the laminate and the at least one circuit component. The method further includes forming a three-dimensional pattern in an exterior surface of the overmold.

In another exemplary aspect, a circuit board is disclosed. The circuit board comprises a printed circuit board, and at least one module disposed on the circuit board. The module includes a laminate and at least one circuit component disposed on the laminate. The module includes an overmold disposed on the at least one circuit component. The overmold comprises an exterior surface comprising a three-dimensional pattern.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc., may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below," or "above," or "upper," or "lower," or "horizontal," or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
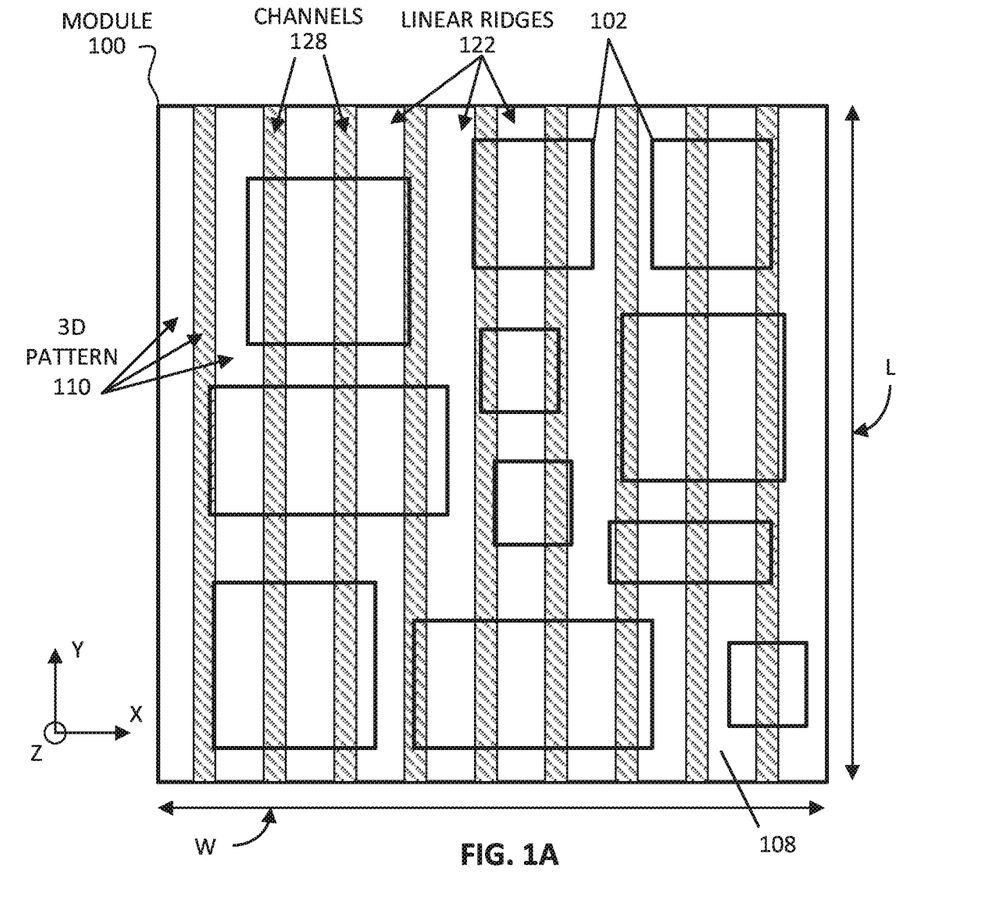
FIG. 1A is a top view of an example of a module, including a three-dimensional (3D) pattern in a top surface of a protective shield.
Figure 1B:
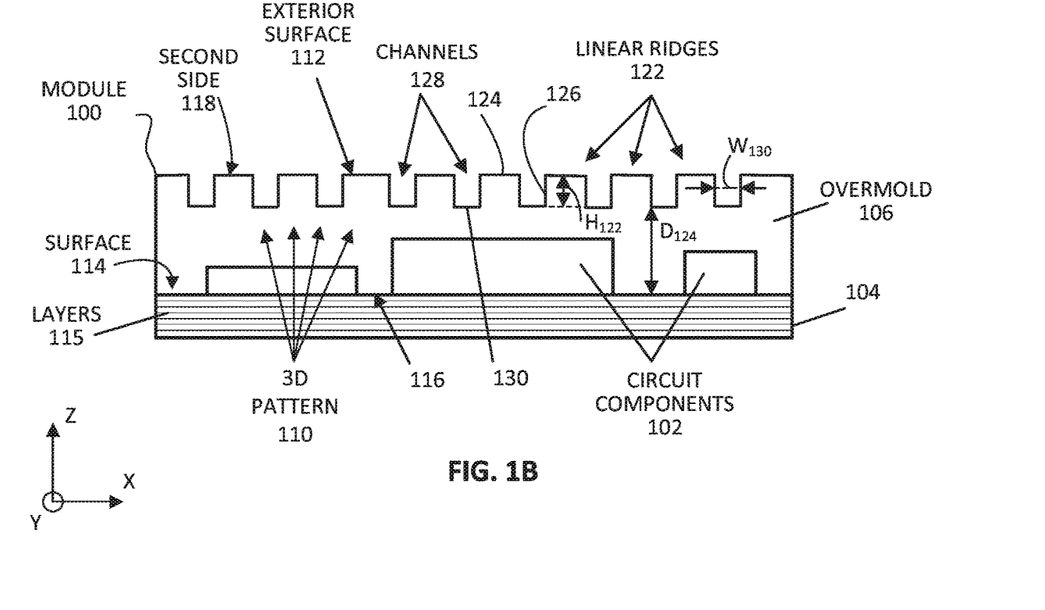
FIG. 1B is a cross-sectional side view of the module in FIG. 1A, illustrating that the 3D pattern is formed in an exterior surface of an overmold.
Figure 1C:
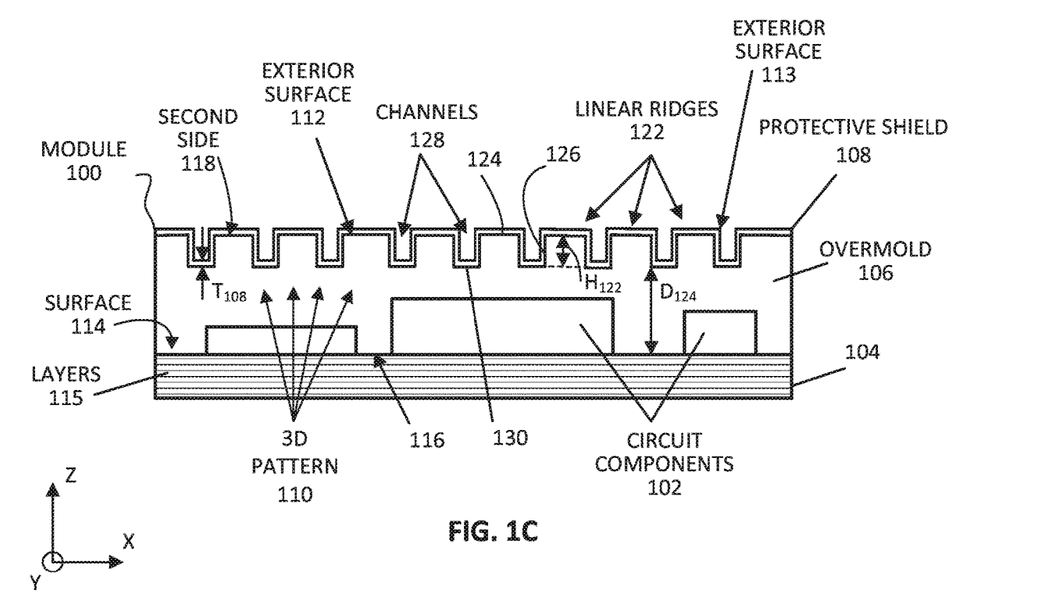
FIG. 1C is a cross-sectional side view of the module in FIG. 1A, illustrating a 3D pattern of a protective shield disposed on a 3D pattern in an exterior surface of an overmold.

FIG. 1A is an illustration of a top view of a module 100 that includes circuit components 102 on a laminate 104. The module 100 also includes an overmold 106 disposed on the circuit components 102 and the laminate 104. FIGS. 1B and 1C are cross-sectional side views of examples of the module 100, where both include the overmold 106, and FIG. 1C further includes a protective shield 108 disposed on the overmold 106. In other aspects, the modules 100 in FIGS. 1B and 1C may be identical.

A three-dimensional (3D) pattern 110 formed in an exterior surface 112 of the overmold 106 increases the surface area of the overmold 106 to improve heat dissipation. In the example in FIG. 1C, an exterior surface 113 of the protective shield 108 disposed on the overmold 106 also conforms to the 3D pattern 110. Increasing the surface area of the module 100 provides more area from which heat can be dissipated. In this manner, the 3D pattern 110 can increase a rate of dissipation (from the module 100) of heat generated by the circuit components 102 in the module 100.

For example, the module 100 may be a radio-frequency (RF) front-end module for use in a mobile device (not shown), such as a cellular telephone. In this example, the module 100 may include various circuit components 102 for data processing and/or for wirelessly transmitting and receiving signals for different telecommunications interfaces, such as cellular telephone, WiFi, Bluetooth, etc. In such an example, each of the telecommunication interfaces operates at different frequencies, and the transmitted/received signals need to be isolated from each other by transmit (TX) filters and receive (RX) filters, which may be bulk acoustic wave (BAW) or surface acoustic wave (SAW) filters. The signals to be transmitted and received also need to be amplified by respective power amplifiers (PAs). Thus, the circuit components 102 may include SAW or BAW devices, PAs, complementary metal oxide semiconductor (CMOS) circuits, and other semiconductor devices, for example.

Each of the data processors, TX filters, RX filters, and PAs produce heat during normal operation, causing temperatures in the module 100 to increase. In situations when multiple circuit components 102 are generating heat simultaneously, it can be difficult to keep the temperatures of the circuit components from increasing to a level at which there may be a negative impact on performance or even permanent physical damage to the circuit components themselves, causing reduced performance and/or failure. Therefore, measures are needed to help reduce internal temperatures of the module 100. As disclosed herein, one such method is to increase the surface area from which heat may be dissipated to the atmosphere, which can increase a rate of heat dissipation. If the rate of heat dissipation can keep up with the rate at which heat is generated internally, the internal temperature of the module 100 can be successfully managed, increasing the performance and the useful life of an electronic device.

The circuit components 102 may be semiconductor devices, for example, which are mounted, coupled, and/or disposed on a surface 114 of the laminate 104. The circuit components 102 may be referred to as surface mount devices (SMDs). The laminate 104 may be a multi-layer substrate comprising layers 115, which may be ground layers or interconnect layers for coupling the circuit components 102 to each other and also to external circuits, such as circuits mounted on a same circuit board as the module 100.

After the circuit components 102 are disposed on the laminate 104, the overmold 106, which comprises any of a variety of known mold compounds suitable for the module 100, is disposed on the circuit components 102 and the laminate 104. The overmold 106 may initially be disposed in fluid form and then allowed to solidify. In this manner, the mold compound may encapsulate and protect each of the circuit components and their connections to the laminate 104 against environmental damage, such as from impact, pressure, vibration, chemicals, water, and humidity, and to improve the dissipation of heat from the circuit components 102.

A first side 116 of the overmold 106 is disposed on the circuit components 102. The exterior surface 112 is on a second side 118 (e.g., an upper side in FIG. 1B) of the overmold 106. The 3D pattern 110 is formed in the exterior surface 112 to increase the area of the exterior surface 112. In some examples, as in FIG. 1B, the exterior surface 112 may be an exterior of the module 100. In other examples, as shown in FIG. 1C, the protective shield 108 may be formed on the 3D pattern 110 of the exterior surface 112. The protective shield 108 may be formed as a layer of any suitable material providing structural protection and thermal conduction. In some examples, the protective shield 108 may be an electrically conductive material, such as a metal, that also provides a reduction of electromagnetic interference between circuit components 102 of the module 100 and circuits external to the module 100. The protective shield 108 may be disposed onto the exterior surface 112 by any suitable method, such as by sputtering, chemical vapor deposition (CVD), metal oxide CVD (MOCVD), etc. In this regard, the exterior surface 112 may be disposed with an approximately constant thickness on the 3D pattern 110.

The 3D pattern 110 may have any suitable shape for increasing the surface area of the exterior surface 112 on the second side 118 of the overmold 106. In the example in FIGS. 1A and 1B, the 3D pattern 110 includes linear ridges 122 extending in the Y-axis direction with a center-to-center pitch P in the X-axis direction. In this regard, a distance $D_{124}$ between the exterior surface 112 and the laminate 104 varies with a thickness of the overmold 106. In the X-axis direction, the distance $D_{124}$ increases and decreases in a repetitive manner according to the pitch P. For example, the pitch P may be in the range of 20 to 500 microns (μm). In other examples, the linear ridges 122 may not have a uniform or constant center-to-center distance.

With or without the protective shield 108 on the exterior surface 112, each of the linear ridges 122 of the 3D pattern 110 extends in the Y-axis direction. The linear ridges 122 each include a ridge portion 124 that may be planar, having been formed as a planar portion of the exterior surface 112 of the overmold 106 (FIG. 1B) or being formed by disposed the protective shield 108 on a planar portion of the exterior surface 112.

The linear ridges 122 also each include channels 126, including a side portion 128 and a bottom portion 130. The side portions 128 of the linear ridges 122 extend between the ridge portion 124 and the bottom portion 130, which is closer to the laminate 104. In this example, the side portion 128 comprises a surface orthogonal to the surface 114 of the laminate 104 and forms at least a portion of a channel 126 between the ridge portions 124. In other examples, the side portions 128 may not be orthogonal to the laminate 104. For example, the side portions 128 may be at an acute angle to the laminate, or may be concave or convex. A bottom portion 130 in the channel 126 closest to the laminate 104 and the ridge portion 124 on top of the linear ridges 122 may be parallel to each other (e.g., and parallel to surface 114 of the laminate 104). Thus, the protective shield 108 (e.g., a layer of metal) may have a same thickness $T_{108}$ where disposed on the bottom portion 130 and the ridge portion 124. Portions of the protective shield 108 may have different thicknesses due to, for example, an angle at which the material of the protective shield 108 is applied to the 3D pattern 110.

A width $W_{130}$ of one of the bottom portions 130 may be in a range of 20 to 250 μm, for example. A height $H_{122}$ of the linear ridges 122 from the bottom portions 130 closest to the laminate 104 to the ridge portions 124 on top of the linear ridges 122 may be in the range of 20 to 1000 μm. Thus, an aspect ratio of the linear ridges 122, based on a ratio of the width $W_{130}$ of the bottom portions 130 to the height $H_{122}$, may be in the range from 1:1 to 1:4. In some examples, the width $W_{130}$ of one of the bottom portions 130 may be in a range of 20 to 125 μm, and the height $H_{122}$ may be in a range of 20 to 500 μm.

The linear ridges 122 are formed by one of several possible means for changing a thickness of the overmold 106 before the protective shield 108 is disposed on the overmold 106. The linear ridges are not formed by merely changing a thickness $T_{108}$ of the protective shield 108 after it is disposed. That is, the 3D pattern 110 is determined by modifications to an exterior surface 112 of the overmold 106. The 3D pattern 110 is formed in the exterior surface 112 of the overmold 106 before the protective shield 108 is applied.

After the overmold 106 has solidified, for example, the exterior surface 112 may be planarized, such as by chemical mechanical polishing (CMP) or any suitable method, such as milling, grinding, buffing, chemical etching, etc. In some examples, the 3D pattern 110 may be formed on the planarized exterior surface 112 by 3D printing additional overmold 106. The linear ridges 122 shown in FIGS. 1A and 1B may then be cut or formed into the exterior surface 112 by sawing, etching, or other methods to form the 3D pattern 110. Although the 3D pattern 110 in the example in FIG. 1B includes only linear ridges 122, the 3D pattern is not limited in this regard.

In some examples, in addition to the linear ridges 122, the 3D pattern 110 may also include linear ridges (not shown) running in another direction (e.g., X-axis direction) not parallel to the linear ridges 122. In other examples, the 3D pattern may include non-linear ridges with curving or arcing portions, which may include circular ridges (e.g., concentric rings).

The overmold 106 extends over a length L and a width W of the module 100. In some examples, to alleviate a hot spot in a module 100, the 3D pattern 110 may extend over only a portion of the overmold 106, which may be less than twenty-five percent (25%) of an area defined by the length L and the width W. In examples where improved heat dissipation is needed for the entire module 100, the 3D pattern 110 may extend over at least 75% of the area A of the protective shield 108.

In some examples, a height $H_{122}$ of the ridges 122 may not be equal in among the ridges 122. The height $H_{122}$ is a distance (e.g., in the Z-axis direction) between the ridge portion 124 and an adjacent one of the bottom portions 130. In an example in which channels 128 are formed by cuts in the protective shield 108, some channels 128 are deeper while all ridge portions 124 may be at a same distance from the substrate 104, wherein a distance from the substrate 104 to the ridge portions 124 is based on a maximum acceptable module height. Alternatively, or additionally, some ridge portions may be higher while the distance $D_{124}$ is the same for all bottom portions 130. In some examples, the channel is cut such that the distance $D_{124}$ is set to a height of the circuit components 102, such that the overmold 106 has a minimal thickness at the bottom portions 130. In examples comprising the protective shield 108 disposed on the overmold 106, the protective shield 108 may be disposed directly on a circuit component 102. In such examples, an absence of overmold between the circuit component 102 and the protective shield 108 improves heat dissipation.

In some examples, the channels 128 are not the entire length L of the module 100. In some examples, the channels 128 may all be a same length, while in other examples the channels 128 may have different respective lengths, which may be determined by a method of forming the 3D pattern 110 or may be based on a shape of an area in which the 3D pattern 110 is formed.

In some examples not shown in FIG. 1B, the module 100 may include circuit components 102 on both sides of the substrate 104. In such examples, the protective shield 108 may extend over the circuit components 102 on both sides of the substrate 104, and the 3D pattern 110 may be, with or without the protective shield 108, on one side or both sides of the module 100.

Figure 2:
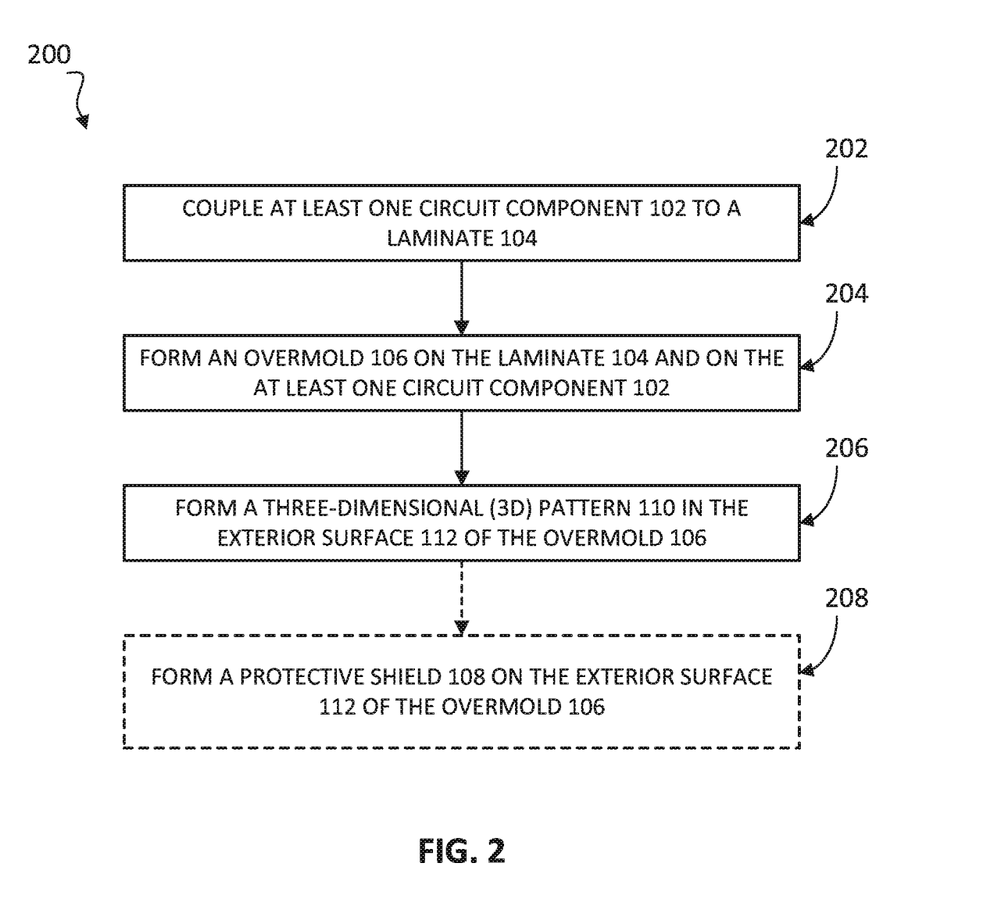
FIG. 2 is a flow chart of a method of fabricating the module in FIGS. 1A and 1B.

FIG. 2 is a flow chart of a method 200 of fabricating the module 100 in FIG. 1. The method 200 includes coupling at least one circuit component 102 to a laminate 104 (block 202) and forming an overmold 106 on the laminate 104 and the at least one circuit component 102 (block 204). For example, forming the overmold 106 on the laminate 104 further includes disposing the overmold 106 on the at least one circuit component 102 and planarizing the overmold 106. The method 200 further includes forming a 3D pattern 110 in the exterior surface 112 of the overmold 106 (block 206). For example, forming the 3D pattern 110 in the exterior surface 112 of the overmold 106 may comprise at least one of chemical etching, milling, laser ablation, and 3D printing. Optionally, fabricating the module 100 may also include forming the protective shield 108 on the exterior surface 112 of the overmold 106 (block 208), wherein an exterior surface 113 of the protective shield 108 includes the 3D pattern 110. Forming the protective shield 108 may include sputtering a conductive material onto the exterior surface 112 of the overmold 106.

Figure 3:
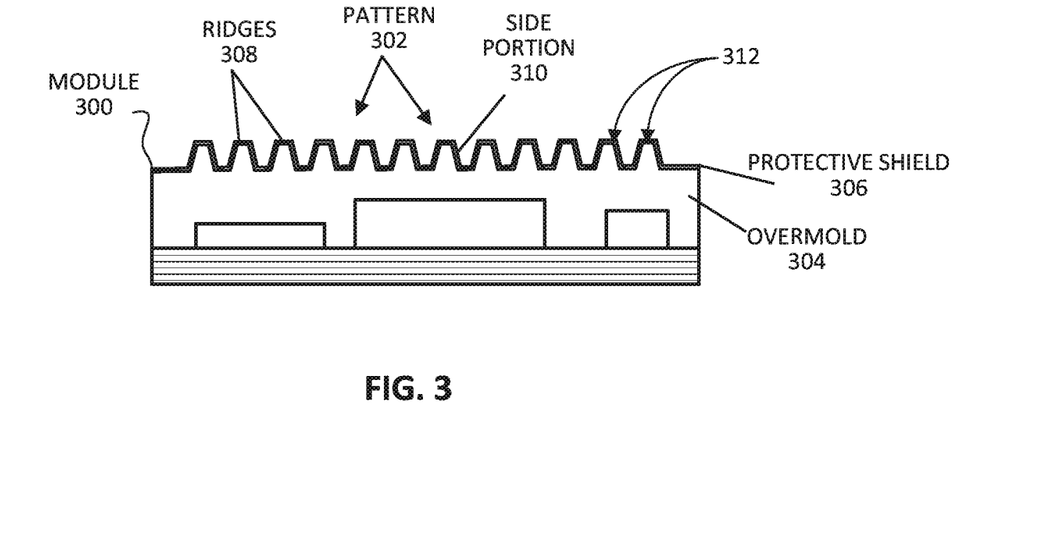
FIG. 3 is a cross-sectional side view of another example of a module comprising a 3D pattern in the protective shield formed by a 3D pattern in the overmold.

FIG. 3 is a cross-sectional side view of another example of a module 300, including a 3D pattern 302 formed in an overmold 304 and a protective shield 306 disposed on the 3D pattern 302 having increased surface area for a higher rate of heat dissipation from the module 300. The protective shield 306 comprises a suitable thermally conductive material, such as a metal, which may also be electrically conductive. This illustration is provided merely to show that the 3D pattern 302 may include ridges 308 having side portions 310 that are not orthogonal to planarized portions 312 of the overmold 304. Thus, the ridges 308 may be formed by methods other than those used to form the linear ridges 122 in FIG. 1B. In another example not shown, the 3D pattern may comprise ridges having a curved profile, such as by chemical etching, for example. The purpose of the 3D pattern is to increase the surface area of the overmold by at least 5%, and in some examples by at least 50%, and is not limited herein to any particular shape or pattern. The 3D pattern may not be a repeating pattern and may be randomly or semi-randomly formed.

Figure 4:
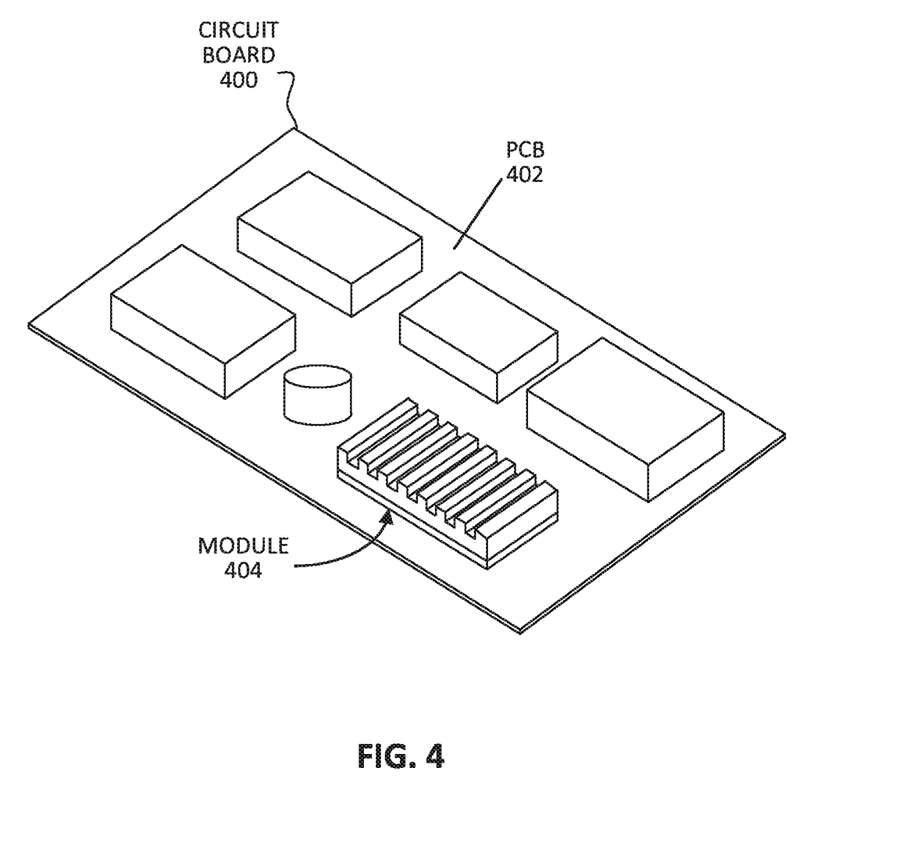
FIG. 4 is a perspective view of one example of a circuit board comprising the module in FIGS. 1A and 1B.

FIG. 4 is an illustration of a perspective view of a circuit board 400, which includes a printed circuit board 402 and at least one module 404 corresponding to the module 100 in FIGS. 1A-1C. The printed circuit board 402 may also include additional modules 404. As shown in FIGS. 1A-1C, the module 404 includes at least one circuit component 102 disposed on a laminate 104, an overmold 106 disposed on the at least one circuit component 102 and the laminate 104 and may include a protective shield 108 disposed on an exterior surface 112 of the overmold 106, where both the overmold 106 and the protective shield 108 include a 3D pattern 110 to increase area through which heat may be dissipated from the module 100.

Figure 5:
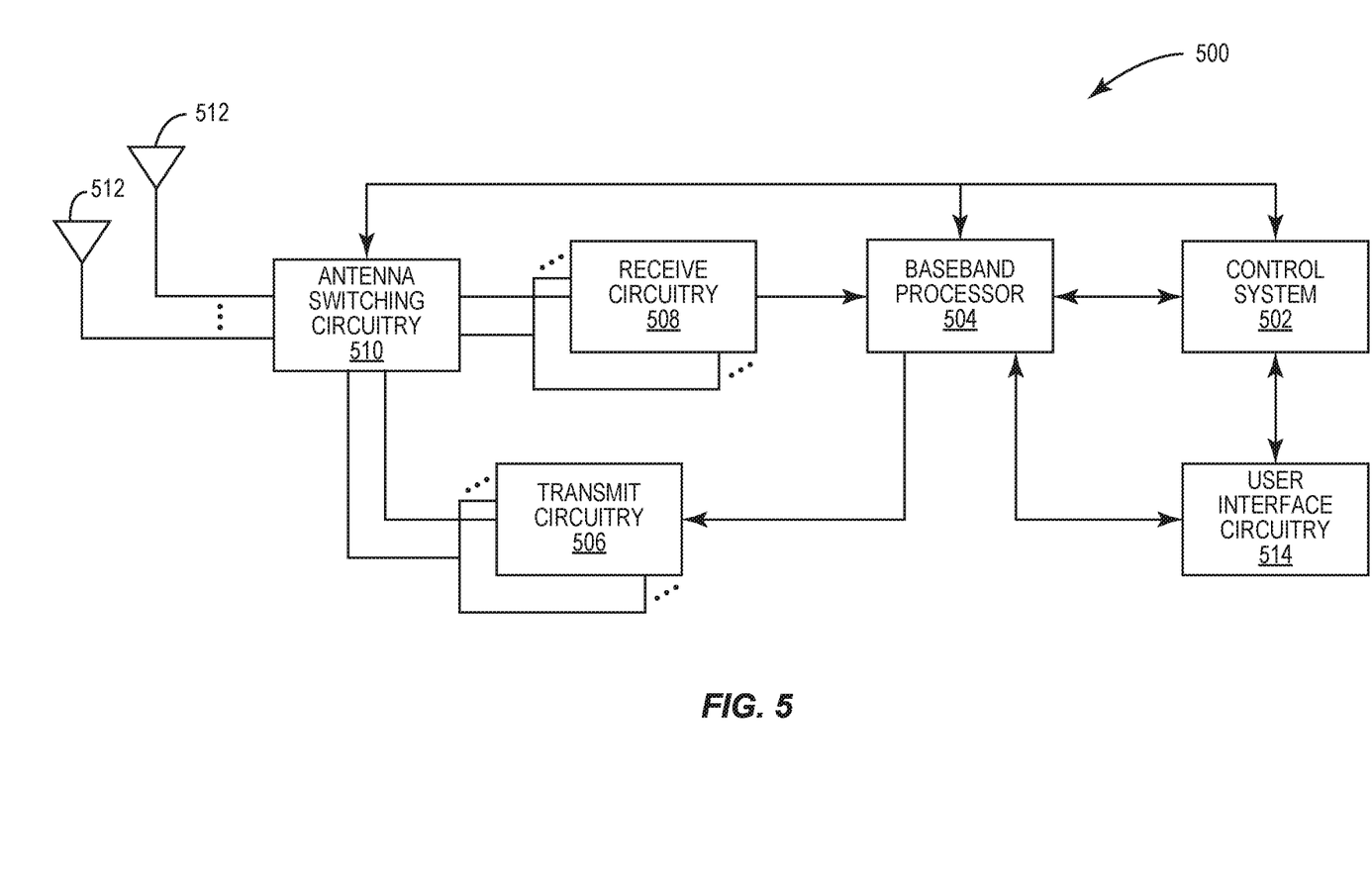
FIG. 5 is an illustration of one example of a user element that may include a module according to FIGS. 1A-1C, 3, and 4.

With reference to FIG. 5, the concepts described above may be implemented in various types of user elements 500, such as mobile terminals, smart watches, tablets, computers, navigation devices, access points, and like wireless communication devices that support wireless communications, such as cellular, wireless local area network (WLAN), Bluetooth, and near field communications. User elements 500 may include modules comprising the 3D pattern 110 of FIG. 1 on an exterior surface. The user elements 500 will generally include a control system 502, a baseband processor 504, transmit circuitry 506, receive circuitry 508, antenna switching circuitry 510, multiple antennas 512, and user interface circuitry 512. In a non-limiting example, the control system 502 can be a field-programmable gate array (FPGA) or an application-specific integrated circuit (ASIC), as an example. In this regard, the control system 502 can include at least a microprocessor(s), an embedded memory circuit(s), and a communication bus interface(s). The receive circuitry 508 receives radio frequency signals via the antennas 512 and through the antenna switching circuitry 510 from one or more base stations. A low noise amplifier and a filter of the receive circuitry 508 cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 504 processes the digitized received signal to extract the information or data bits conveyed in the received signal. This processing typically comprises demodulation, decoding, and error correction operations, as will be discussed on greater detail below. The baseband processor 504 is generally implemented in one or more digital signal processors (DSPs) and application-specific integrated circuits (ASICs).

For transmission, the baseband processor 504 receives digitized data, which may represent voice, data, or control information, from the control system 502, which it encodes for transmission. The encoded data is output to the transmit circuitry 506, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 40 through the antenna switching circuitry 510 to the antennas 512. The multiple antennas 512 and the replicated transmit and receive circuitries 506, 508 may provide spatial diversity. Modulation and processing details will be understood by those skilled in the art.

Those skilled in the art will recognize improvements and modifications to the present disclosure. All such improvements and modifications are considered within the scope of the concepts disclosed herein.

What is claimed is:

1. A module comprising:
   a laminate;
   at least one circuit component disposed on the laminate;
   an overmold disposed on the at least one circuit component,
   wherein:
     an exterior surface of the overmold comprises a three-dimensional (3D) pattern; and a protective shield comprising an electrically conductive material configured to reduce electromagnetic interference from the at least one circuit disposed on the overmold.

2. The module of claim 1, wherein an exterior surface of the protective shield comprises the 3D pattern.

3. The module of claim 1, wherein:
a first side of the overmold is disposed on the at least one circuit; and
a second side of the overmold comprises the exterior surface.

4. The module of claim 1, wherein:
the protective shield comprises a length and a width; and
the 3D pattern extends over less than 25% of an area of the protective shield determined by the length and the width.

5. The module of claim 1, wherein:
the protective shield comprises a length and a width; and
the 3D pattern extends over at least 75% of an area of the protective shield determined by the length and the width.

6. The module of claim 1, wherein the 3D pattern comprises linear ridges extending in a first direction.

7. The module of claim 6, wherein:
a distance between the laminate and the exterior surface varies repetitively in a second direction orthogonal to the first direction.

8. The module of claim 6, wherein the 3D pattern further comprises ridges extending in a second direction not parallel to the first direction.

9. The module of claim 1, wherein the 3D pattern comprises non-linear ridges.

10. The module of claim 1, wherein the non-linear ridges comprise curved portions.

11. The module of claim 6, wherein each of the linear ridges comprises:
a ridge portion of the exterior surface extending in the first direction at a first distance from the laminate; and
a side portion of the exterior surface extending from the ridge portion and closer to the laminate.

12. The module of claim 11, wherein:
the ridge portion comprises a planar portion; and
the side portion comprises at least a portion of a channel.

13. The module of claim 12, further comprising a protective shield disposed on the overmold, wherein:
an exterior surface of the protective shield comprises the 3D pattern;
the 3D pattern comprises linear ridges comprising a ridge portion and a side portion;
the protective shield comprises a first thickness on the ridge portion; and
the protective shield comprises the first thickness in the channel at a location closest to the laminate.

14. The module of claim 2, wherein the protective shield comprises a thermally conductive metal layer.

15. The module of claim 1, wherein the at least one circuit component comprises one of an acoustic filter and a power amplifier.

16. A method of fabricating a module comprising:
coupling at least one circuit component to a laminate;
forming an overmold on the laminate and on the at least one circuit component; and
forming a three-dimensional pattern in an exterior surface of the overmold;
forming a protective shield comprising an electrically conductive material on the exterior surface of the overmold to reduce electromagnetic interference from the at least one circuit component.

17. The method of claim 16, wherein an exterior surface of the protective shield comprises the 3D pattern.

18. The method of claim 16, comprising:
forming the overmold on the laminate further comprises disposing the overmold on the at least one circuit component; and
planarizing the overmold.

19. The method of claim 18, comprising:
forming the three-dimensional pattern in the overmold comprises at least one of chemical etching, milling, and 3D printing.

20. The method of claim 17, wherein forming the protective shield comprises sputtering a thermally conductive material onto the exterior surface of the overmold.

21. A circuit board comprising:
a printed circuit board (PCB);
at least one module disposed on a surface of the PCB, the at least one module comprising:
a laminate;
at least one circuit component disposed on the laminate; and
an overmold disposed on the at least one circuit component,
wherein:
the overmold comprises an exterior surface comprising a three-dimensional (3D) pattern; and
a protective shield comprising an electrically conductive material configured to reduce electromagnetic interference from the at least one circuit disposed on the overmold.

\* \* \* \* \*